(12) United States Patent
Ning et al.

(10) Patent No.: US 9,368,453 B2
(45) Date of Patent: Jun. 14, 2016

(54) OVERLAY MARK DEPENDENT DUMMY FILL TO MITIGATE GATE HEIGHT VARIATION

(71) Applicant: GLOBALFOUNDRIES Inc., Grand Cayman (KY)

(72) Inventors: Guoxiang Ning, Ballston Lake, NY (US); Chan Seob Cho, Loudonville, NY (US); Paul Ackmann, Gansevoort, NY (US); Jung Yu Hsieh, Saratoga Springs, NY (US); Hui Peng Koh, Gansevoort, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/948,476

(22) Filed: Nov. 23, 2015

(65) Prior Publication Data

US 2016/0079180 A1 Mar. 17, 2016

Related U.S. Application Data

(62) Division of application No. 14/243,491, filed on Apr. 2, 2014.

(51) Int. Cl.
*H01L 23/544* (2006.01)
*H01L 29/49* (2006.01)

(52) U.S. Cl.
CPC .......... *H01L 23/544* (2013.01); *H01L 29/4916* (2013.01); *H01L 2223/54426* (2013.01)

(58) Field of Classification Search
CPC ................... H01L 23/544; H01L 2223/54426; H01L 21/32139; H01L 22/12; H01L 27/088; H01L 21/30625; G03F 9/7076; G03F 1/42; G03F 7/70633; G03F 9/7084
USPC ....................................................... 257/797
See application file for complete search history.

(56) References Cited

U.S. PATENT DOCUMENTS 6,803,291 B1 10/2004 Fu et al.
2011/0051150 A1 3/2011 Choi et al.

*Primary Examiner* — Caleen Sullivan
(74) *Attorney, Agent, or Firm* — Ditthavong & Steiner, P.C.

(57) ABSTRACT

A method of forming dummy structures and an overlay mark protection zone over an active layer zone based on the shape of an overlay mark and the resulting device are provided. Embodiments include determining a size and a shape of an overlay mark; determining a size and a shape of an overlay mark protection zone based on the shape of the overlay mark; determining a shape of a plurality of dummy structures based on the shape of the overlay mark; determining a size and a shape of an active layer zone based on the size and the shape of the overlay mark and the plurality of dummy structures; forming the active layer zone in an active layer of a semiconductor substrate; forming the overlay mark and the plurality of dummy structures over the active layer zone in a poly layer of the semiconductor substrate; and planarizing the poly layer.

15 Claims, 4 Drawing Sheets

OVERLAY MARK DEPENDENT DUMMY FILL TO MITIGATE GATE HEIGHT VARIATION

RELATED APPLICATION

The present application is a Divisional application of application Ser. No. 14/243,491, filed on Apr. 2, 2014, which is incorporated herein by reference in its entirety.

TECHNICAL FIELD

The present disclosure relates to semiconductor device overlay measurement processes. The present disclosure is particularly applicable to semiconductor overlay mark alignment processes for 20 nanometer (nm) technology nodes and beyond.

BACKGROUND

Current overlay measurements are often not stable due to gate height variation within the polysilicon (poly) layer, which results from chemical mechanical polishing (CMP) of the poly layer. As a result of the over polishing, for example, the requisite contrast between layers is degraded, which produces overlay metrology noise and prevents accurate gate to trench block (TB) overlay data feedback to a scanner for correction.

A need therefore exists for methodology enabling reduced gate height variation of a poly layer after CMP for stable overlay measurements, and the resulting device.

SUMMARY

An aspect of the present disclosure is method of forming a plurality of dummy structures and an overlay mark protection zone over at least one active layer zone based on the shape of an overlay mark.

Another aspect of the present disclosure is a device including a plurality of dummy structures formed in a poly layer over an active layer zone based on the shape of the overlay mark.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a size and a shape of an overlay mark; determining a size and a shape of an overlay mark protection zone based on the shape of the overlay mark; determining a shape of a plurality of dummy structures based on the shape of the overlay mark; determining a size and a shape of at least one active layer zone based on the size and the shape of the overlay mark and the plurality of dummy structures; forming the at least one active layer zone in an active layer of a semiconductor substrate; forming the overlay mark and the plurality of dummy structures over the at least one active layer zone in a poly layer of the semiconductor substrate; and planarizing the poly layer.

Aspects of the present disclosure include forming the plurality of dummy structures in four distinct dummy fields; forming the overlay mark protection zone in a square or rectangle shape; and aligning each distinct dummy field adjacent to a different corner of the overlay mark protection zone. Other aspects include forming the overlay mark in a square or a rectangle shape; forming the overlay mark protection zone in a square or a rectangle shape, respectively, with a width outside of the overlay mark greater than zero; and forming the plurality of dummy structures in four distinct dummy fields each having a square or a rectangle shape, respectively. Further aspects include forming the overlay mark in a cross shape; and forming the overlay mark protection zone in a square or a rectangle equal to or larger than a smallest square that can be formed around the overlay mark. Another aspect includes forming the plurality of dummy structures in four distinct dummy fields; and forming each of the four distinct dummy fields in a square, a rectangle, or a right angle shape. Additional aspects include forming the at least one active layer zone in a cross shape; and forming each of the four distinct dummy fields in the right angle shape. Other aspects include forming the at least one active layer zone in a square or rectangle shape; and forming each of the four distinct dummy fields in the square or the rectangle shape, respectively. Further aspects include forming the at least one active layer zone as five non-contiguous regions based on the size, the shape, and respective locations of the overlay mark and the plurality of dummy structures. Another aspect includes planarizing the poly layer by CMP.

Another aspect of the present disclosure is a device including: a semiconductor substrate; an active layer including at least one active layer zone; and a poly layer over the active layer and including an overlay mark and a plurality of dummy structures, each formed on the at least one active layer zone. Aspects of the device include a size and a shape of the at least one active layer zone being determined based on a size, a shape and a location of the overlay mark and the plurality of dummy structures. Other aspects include the plurality of dummy structures being formed in four distinct dummy fields. Further aspects include a square or rectangular overlay mark protection zone being formed around the overlay mark, wherein each of the four distinct dummy fields is formed adjacent to a different corner of the overlay mark protection zone. Another aspect includes the overlay mark being formed in a square or a rectangle, an overlay mark protection zone being formed in a square or rectangle shape, respectively, with a width outside of the overlay mark being greater than zero, and each of the plurality of dummy structures being formed in a square or a rectangle shape, respectively. Additional aspects include the overlay mark being formed in a cross and the at least one active layer being is formed in a square or rectangle shape, an overlay mark protection zone being formed in a square or a rectangle equal to or larger than a smallest square that can be formed around the overlay mark, and each of the plurality of dummy structures being formed in a square or a rectangle shape. Other aspects include the overlay mark being formed in a cross and the at least one active layer being formed in a cross shape, an overlay mark protection zone being formed in a square shape equal to or larger than a smallest square that can be formed around the overlay mark, and each of the plurality of dummy structures being formed in a right-angle shape.

Another aspect of the present disclosure is a method including: determining a size and a shape of an overlay mark; determining a size and a shape of an overlay mark protection zone around the overlay mark based on the shape of the overlay mark; determining a shape of a plurality of dummy structures based on the shape of the overlay mark; determining a size, a shape and a location of at least one active layer zone based on the size, the shape and a location of the overlay mark and the plurality of dummy structures; forming the at least one active layer zone in an active layer of a semiconductor substrate; forming the overlay mark over the at least one active layer zone in a poly layer of the semiconductor substrate; forming the plurality of dummy structures in four distinct dummy fields in the poly layer, outside, but adjacent to, the overlay mark protection zone, each dummy field based on the shape of the overlay mark; and planarizing the poly layer by CMP. Other aspects include forming the overlay mark in a square or a rectangle shape; forming the overlay mark protection zone in a square or a rectangle shape, respectively, with a width outside of the overlay mark greater than zero; and forming each of the four distinct dummy fields in a square or a rectangle shape, respectively, diagonally aligned with a different corner of the overlay mark protection zone. Further aspects include forming the overlay mark in a cross shape; and forming the overlay mark protection zone in a square or a rectangle shape equal to or greater than a smallest square that can be formed around the overlay mark; and forming the active layer zone in a square or rectangle shape and forming each of the four distinct dummy fields in a square or a rectangle shape, respectively, diagonally aligned with a different corner of the overlay mark protection zone, or forming the active layer zone in a cross shape and forming the overlay protection zone in a square and each of the four distinct dummy fields in a right-angle shape at a different corner of the overlay mark protection zone. Another aspect includes forming the least one active layer zone as five non-contiguous regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of unstable overlay measurements attendant upon gate height variation in a poly layer after CMP. By forming both the overlay mark and the dummy structures on an active layer zone, gate height variation can be reduced and overlay stability improved.

Methodology in accordance with embodiments of the present disclosure includes determining a size and a shape of an overlay mark. A size and a shape of an overlay mark protection zone are determined based on the shape of the overlay mark. A shape of a plurality of dummy structures is determined based on the shape of the overlay mark. A size and a shape of at least one active layer zone are determined based on the size and the shape of the overlay mark and the plurality of dummy structures. The at least one active layer zone is formed in an active layer of a semiconductor substrate. The overlay mark and the plurality of dummy structures are formed in a poly layer of the semiconductor substrate over the at least one active layer zone. The poly layer is planarized.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
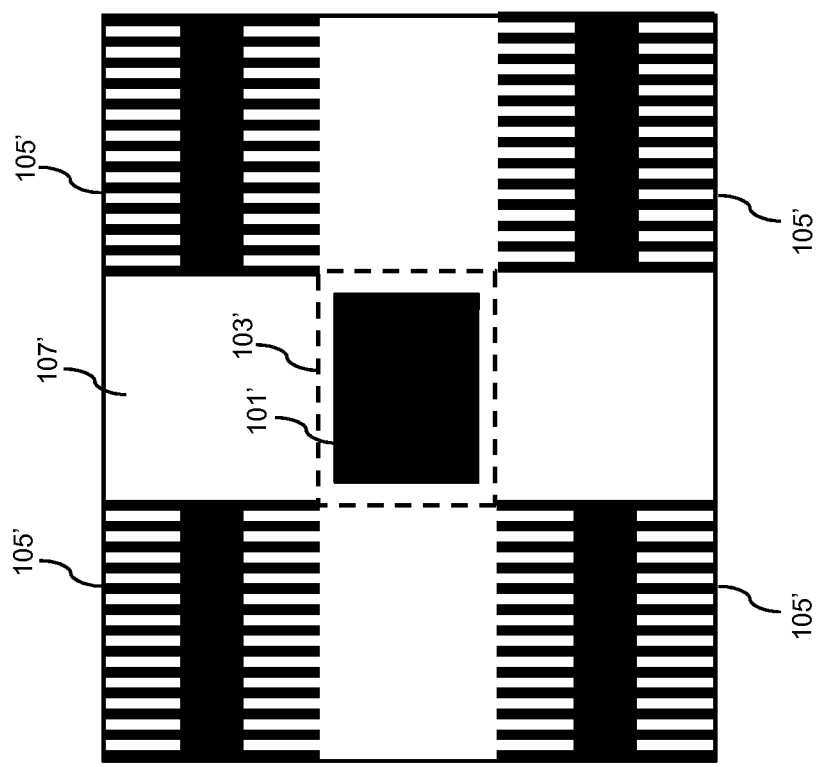
FIGS. 1A and 1B schematically illustrate forming a plurality of dummy structures and an overlay mark protection zone over an active layer zone based on an overlay mark formed in a square or a rectangle shape, in accordance with an exemplary embodiment.
Figure 1A:
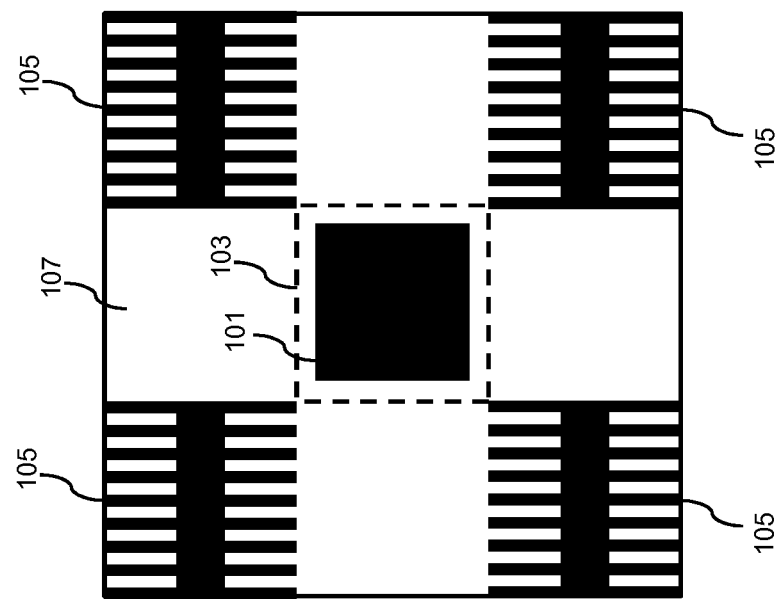

Adverting to FIG. 1A, once a size and a shape of an overlay mark 101 are determined, e.g., a square, the size and the shape of an overlay mark protection zone 103 are determined based on the shape of the overlay mark 101. In particular, if the shape of the overlay mark 101 is a square, then the overlay mark protection zone 103 is also formed in a square shape with a width outside of the overlay mark 101 greater than zero. Next, the shape of a plurality of dummy structures 105, e.g., a square, is determined based on the shape of the overlay mark 101. A size and a shape of an active layer zone 107, e.g., a square, are then determined based on the size and shape of the combination of the overlay mark 101 and the plurality of dummy structures 105. Thereafter, the active layer zone 107 is formed in an active layer of a semiconductor substrate (not shown for illustrative convenience). The overlay mark 101 and the plurality of dummy structures 105 are then formed over the active layer zone 107 in a poly layer of the semiconductor substrate (not shown for illustrative convenience). In particular, the plurality of dummy structures 105 are formed in four distinct dummy fields and each distinct dummy field is aligned adjacent to a different corner of the overlay mark protection zone 103. Thereafter, the poly layer is planarized by CMP.

In FIG. 1B, similar to FIG. 1A, once a size and a shape of an overlay mark 101' are determined, e.g., a rectangle in this case, the size and the shape of an overlay mark protection zone 103', e.g., a rectangle, are determined based on the shape of the overlay mark 101'. Also similar to FIG. 1A, if the shape of the overlay mark 101' is a rectangle shape, then the overlay mark protection zone 103' is formed in a rectangle shape with a width outside of the overlay mark 101' greater than zero. Next, the shape of a plurality of dummy structures 105', e.g., a rectangle, is determined based on the shape of the overlay mark 101'. A size and a shape of an active layer zone 107', e.g., a rectangle, are then determined based on the size and the shape of the overlay mark 101' and the plurality of dummy structures 105'. Thereafter, the active layer zone 107' is formed in an active layer of a semiconductor substrate (not shown for illustrative convenience). The overlay mark 101' and the plurality of dummy structures 105' are then formed over the active layer zone 107' in a poly layer of the semiconductor substrate (not shown for illustrative convenience). As in FIG. 1A, the plurality of dummy structures 105' are formed in four distinct dummy fields and each distinct dummy field is aligned adjacent to a different corner of the overlay mark protection zone 103'. Thereafter, the poly layer is planarized by CMP.

Figure 2A:
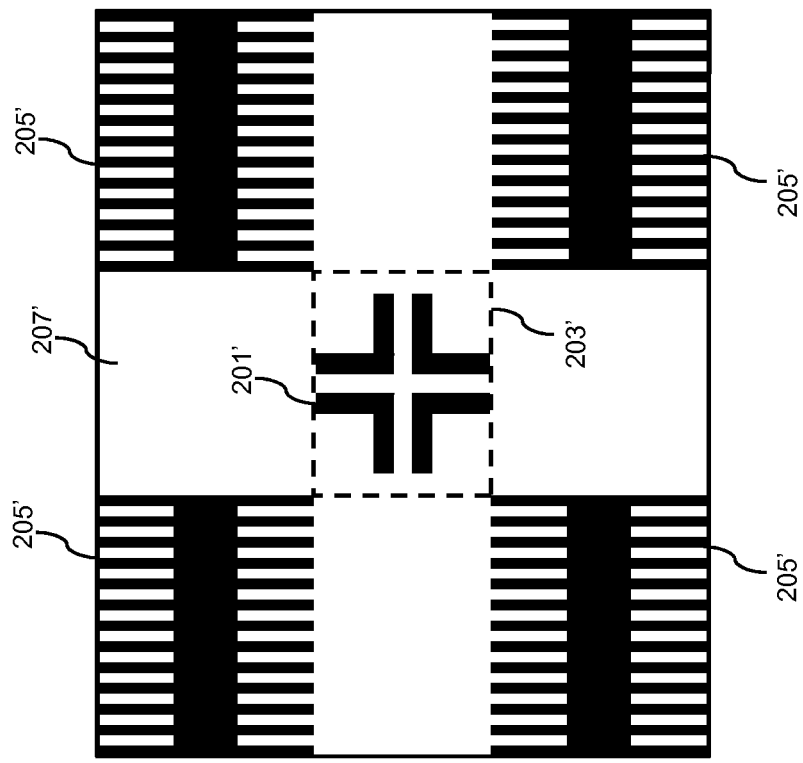
FIGS. 2A and 2B schematically illustrate forming a plurality of dummy structures and an overlay mark protection zone over an active layer zone based on an overlay mark formed in a cross shape, in accordance with an exemplary embodiment.
Figure 2B:
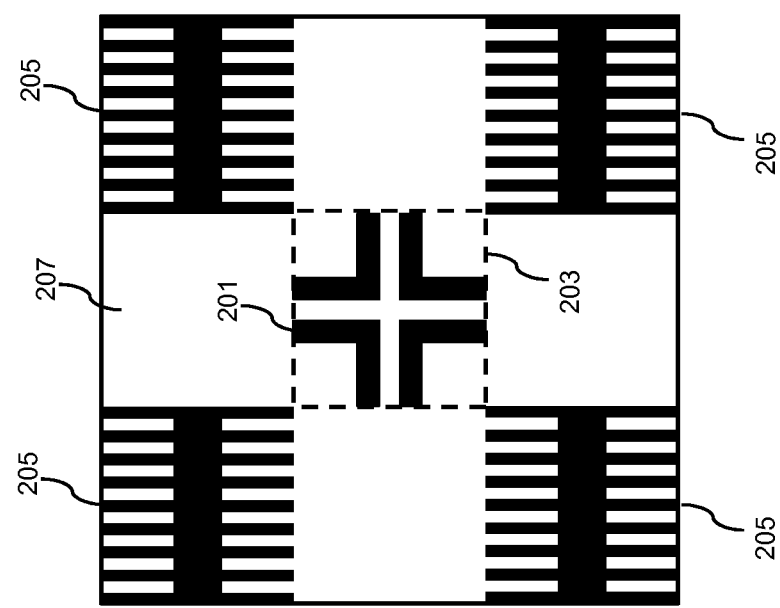

The processes of FIGS. 2A and 2B are nearly identical to the processes of FIGS. 1A and 1B, respectively, except that the overlay marks 201 and 201' are cross-shaped instead of the square overlay mark 101 and the rectangle overlay mark 101'. If the shape of the overlay mark 201 is a cross shape and the plurality of dummy structures 205 are formed in a square shape, then the overlay mark protection zone 203 is formed in a square shape equal to or larger than the smallest square that can be formed around the overlay mark 201, as illustrated in FIG. 2A.

However, if the shape of the overlay mark 201' is a cross shape and the plurality of dummy structures 205' are formed in a rectangle shape, then the overlay mark protection zone 203' is formed in a rectangle shape equal to or larger than the smallest rectangle that can be formed around the overlay mark 201'.

Figure 3:
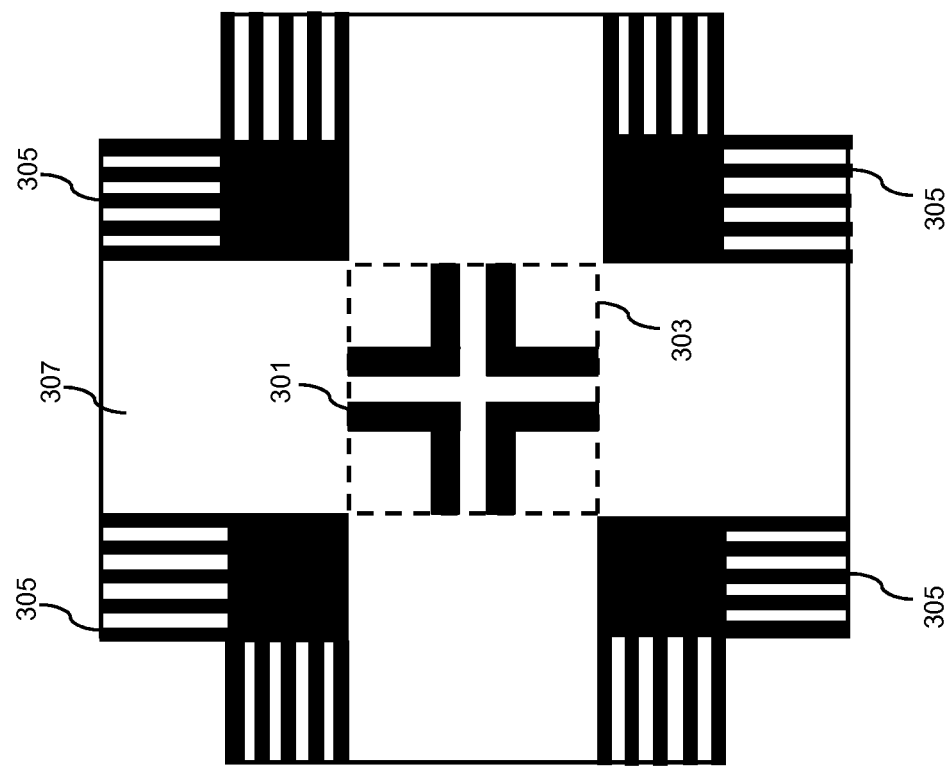
FIG. 3 schematically illustrates forming a plurality of L-shaped dummy structures and an overlay mark protection zone over an active layer zone based on an overlay mark formed in a cross shape, in accordance with an exemplary embodiment.

Adverting to FIG. 3, similar to FIGS. 2A and 2B, once a size and a shape of an overlay mark 301 are determined, e.g., a cross shape, the size and the shape of an overlay mark protection zone 303 are determined based on the shape of the overlay mark 301. Since the shape of the overlay mark 301 is a cross shape, then the overlay mark protection zone 303 may be formed in a square or a rectangle shape equal to or larger than the smallest square or rectangle, respectively, that can be formed around the overlay mark 301. Next, the shape of a plurality of dummy structures 305, e.g., an L-shape, is determined based on the shape of the overlay mark 301. A size and a shape of an active layer zone 307, e.g., a cross shape, are then determined based on the size and shape of the overlay mark 301 and the plurality of dummy structures 305. Thereafter, the active layer zone 307 is formed in an active layer of a semiconductor substrate (not shown for illustrative convenience). The overlay mark 301 and the plurality of dummy structures 305 are then formed over the active layer zone 307 in a poly layer of the semiconductor substrate (not shown for illustrative convenience). In particular, the plurality of dummy structures 305 are formed in four distinct dummy fields, each in a right-angle shape at a different corner of the overlay mark protection zone 303. Thereafter, the poly layer is planarized by CMP.

Figure 4:
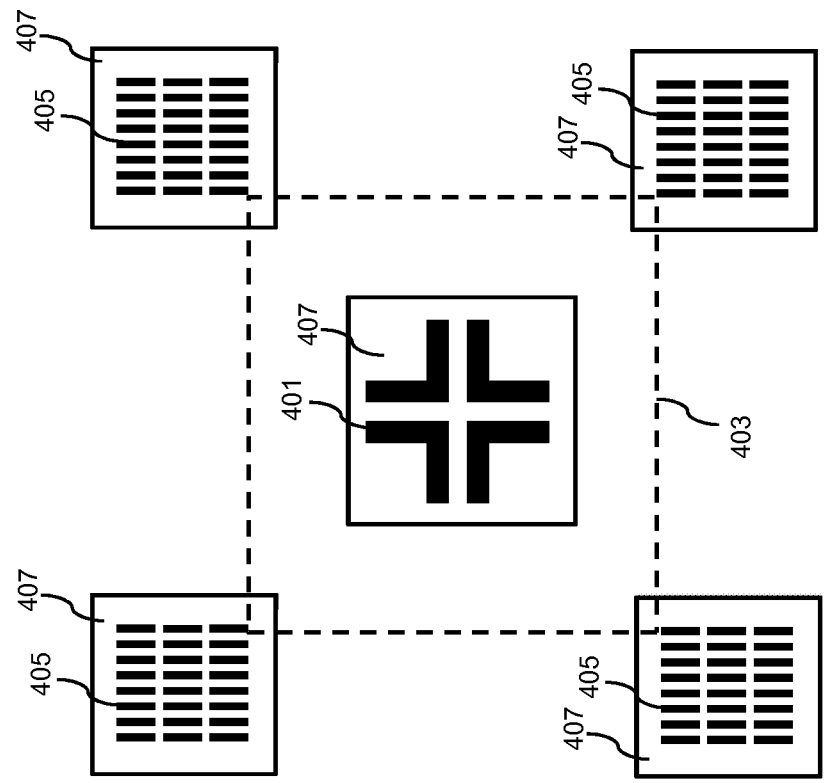
FIG. 4 schematically illustrates forming a plurality of dummy structures and an overlay mark protection zone over a plurality of active layer zones based on an overlay mark formed in a cross shape, in accordance with an exemplary embodiment.

The overlay mark protection zone may alternatively be determined to be much greater than the smallest square that can be formed around the overlay mark, as depicted in FIG. 4. Similar to FIG. 2A, once a size and a shape of an overlay mark 401 are determined, e.g., a cross shape, the size and the shape of an overlay mark protection zone 403 are determined based on the shape of the overlay mark 401. Next, the shape of a plurality of dummy structures 405, e.g., a square shape, is determined based on the shape of the overlay mark 401. A size and a shape of the active layer zone 407, are then determined based on the size and shape of the overlay mark 401 and the plurality of dummy structures 405. However, rather than having one large active layer zone that can support the protection zone and all four dummy structures, the active layer zone 407 is formed as five non-contiguous regions based on the size, the shape, and respective locations of the overlay mark 401 and the plurality of dummy structures 405. Thereafter, the five non-contiguous active layer zones 407 are formed in an active layer of a semiconductor substrate (not shown for illustrative convenience). The overlay mark 401 and the plurality of dummy structures 405 are then formed over the five non-contiguous active layer zones 407 in a poly layer of the semiconductor substrate (not shown for illustrative convenience). The dummy structures 405 are formed in four distinct dummy fields, each distinct dummy field being aligned adjacent to a different corner of the overlay mark protection zone 403. Thereafter, the poly layer is planarized by CMP.

The embodiments of the present disclosure can achieve several technical effects including minimizing gate height variation of a poly layer after CMP, reducing overlay metrology noise, and enabling accurate overlay data feedback to a scanner for correction. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in various types of semiconductor alignment processes for 20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a semiconductor substrate;
    an active layer including at least one active layer zone;
    a polysilicon (poly) layer over the active layer and including an overlay mark and a plurality of dummy structures, each formed on the at least one active layer zone and formed in four distinct dummy fields; and
    a square or rectangular overlay mark protection zone around the overlay mark, wherein one of the four distinct dummy fields is aligned at each corner of the overlay mark protection zone.

2. The device according to claim 1, wherein a size and a shape of the at least one active layer zone is determined based on a size, a shape and a location of the overlay mark and the plurality of dummy structures.

3. The device according to claim 1, wherein the overlay mark is formed in a square or a rectangle, the device further comprising an overlay mark protection zone in a square or rectangle shape, respectively, with a width outside of the overlay mark greater than zero, and each of the plurality of dummy structures is formed in a square or a rectangle shape, respectively.

4. The device according to claim 1, wherein the overlay mark is formed in a cross and the at least one active layer is formed in a square or rectangle shape, the device further comprising an overlay mark protection zone formed in a square or a rectangle equal to or larger than a smallest square that can be formed around the overlay mark, and each of the plurality of dummy structures is formed in a square or a rectangle shape.

5. The device according to claim 1, wherein the overlay mark is formed in a cross and the at least one active layer is formed in a cross shape, the device further comprising an overlay mark protection zone formed in a square shape equal to or larger than a smallest square that can be formed around the overlay mark, and each of the plurality of dummy structures is formed in a right-angle shape.

6. A device comprising:
- a semiconductor substrate;
- an active layer including at least one active layer zone;
- a polysilicon (poly) layer over the active layer and including an overlay mark and a plurality of dummy structures, each formed on the at least one active layer zone; and
- a square or rectangular overlay mark protection zone around the overlay mark,
- wherein one of the plurality of dummy structures is aligned at each corner of the overlay mark protection zone.

7. The device according to claim 6, wherein a size and a shape of the at least one active layer zone is determined based on a size, a shape and a location of the overlay mark and the plurality of dummy structures.

8. The device according to claim 6, wherein the overlay mark is formed in a square or a rectangle, the device further comprising an overlay mark protection zone in a square or rectangle shape, respectively, with a width outside of the overlay mark greater than zero, and each of the plurality of dummy structures is formed in a square or a rectangle shape, respectively.

9. The device according to claim 6, wherein the overlay mark is formed in a cross and the at least one active layer is formed in a square or rectangle shape, the device further comprising an overlay mark protection zone formed in a square or a rectangle equal to or larger than a smallest square that can be formed around the overlay mark, and each of the plurality of dummy structures is formed in a square or a rectangle shape.

10. The device according to claim 6, wherein the overlay mark is formed in a cross and the at least one active layer is formed in a cross shape, the device further comprising an overlay mark protection zone formed in a square shape equal to or larger than a smallest square that can be formed around the overlay mark, and each of the plurality of dummy structures is formed in a right-angle shape.

11. A device comprising:
- a semiconductor substrate;
- an active layer including active layer zones;
- a polysilicon (poly) layer over the active layer and including a cross shape overlay mark and a plurality of dummy structures, each formed on the active layer zones; and
- an overlay mark protection zone in a square or a rectangle shape equal to or larger than a smallest square that can be formed around the cross shape overlay mark, wherein:
- the plurality of dummy structures are formed in four distinct dummy fields,
- each of the four distinct dummy fields is formed in a square or rectangle, and
- one of the four distinct dummy fields is aligned at each corner of the overlay mark protection zone.

12. The device according to claim 11, wherein the active layer zones are non-contiguous.

13. The device according to claim 12, wherein the active layer zones are in a cross shape.

14. The device according to claim 11, wherein the poly layer is planarized.

15. The device according to claim 11, wherein a size and a shape of each of the active layer zones is determined based on a size, a shape and a location of the overlay mark and the plurality of dummy structures.

\* \* \* \* \*